United States Patent [19]

Quenzer et al.

[11] Patent Number: 5,407,856
[45] Date of Patent: Apr. 18, 1995

[54] DIRECT SUBSTRATE BONDING

[75] Inventors: Hans J. Quenzer, Berlin; Wolfgang Benecke, Vorwerk-Buchholz, both of Germany

[73] Assignee: Fraunhofer Gesellschaft zur Forderung der angewandten Forschung, Munich, Germany

[21] Appl. No.: 146,088
[22] PCT Filed: May 8, 1992
[86] PCT No.: PCT/DE92/00365
    § 371 Date: May 9, 1994
    § 102(e) Date: May 9, 1994
[87] PCT Pub. No.: WO92/20094
    PCT Pub. Date: Nov. 12, 1992

[30] Foreign Application Priority Data

May 8, 1991 [DE] Germany .................... 41 15 046.5

[51] Int. Cl.$^6$ ............................................. H01L 21/76
[52] U.S. Cl. ....................................... 437/61; 437/62; 437/974; 148/DIG. 12; 148/DIG. 135
[58] Field of Search ................... 437/61, 62, 974; 148/DIG. 12, DIG. 135

[56] References Cited

U.S. PATENT DOCUMENTS

| 4,878,957 | 11/1989 | Yamaguchi et al. | 437/974 |
| 4,883,215 | 11/1989 | Goesele et al. | 148/DIG. 12 |
| 5,028,558 | 7/1991 | Haisma et al. | 437/62 |
| 5,196,375 | 3/1993 | Hoshi | 148/DIG. 12 |
| 5,238,875 | 8/1993 | Ogino | 148/DIG. 12 |
| 5,266,135 | 11/1993 | Short et al. | 437/62 |

FOREIGN PATENT DOCUMENTS

| 0189145 | 7/1989 | Japan | 148/DIG. 12 |
| 0074924 | 3/1993 | Japan | 437/62 |
| 2206445 | 1/1989 | United Kingdom | 148/DIG. 12 |

OTHER PUBLICATIONS

Stevenage; "SOI by Wafer Bonding with Spin-On-Glass as Adhesive" Electronic Letters; vol. 23; No. 1, Jan. 1987, pp. 39–40.

Xiao-Li et al., "Si On SiO2 by Solid-State Diffusion Bonding (SSDB) Technology", Extended Abstracts of the 20th (1988 International) Conference On Solid State Devices and Materials, Tokyo, 1988, pp. 197–200.

Maszara et al., "Bonding of Silicon Wafers for Silicon-On-Insulator", Journal of Applied Physics, vol. 64, No. 10, Part I, 1988, pp. 4943–4950.

Haisman et al., "Silicon-On-Insulator Wafer Bonding-Wafer Thinning Technology Evaluations"; Japanese Journal of Applied Physics; vol. 28, No. 8, 1989, Part 1, Tokyo, JP, pp. 1426–1443.

Yablonovitch et al., "Van Der Waals Bonding of GAAS Epitaxial Lift Off Films onto Arbitrary Substrates", Applied Physics Letters, vol. 56, No. 24, 1990, pp. 2419–2421.

Primary Examiner—Brian E. Hearn
Assistant Examiner—Trung Dang
Attorney, Agent, or Firm—Antonelli, Terry, Stout & Kraus

[57] ABSTRACT

Disclosed is a process for producing a solid, surface bonding between two wafer plates, of which at least one is composed of a semiconducting material, such as e.g. silicon. The process has the following steps: on the cleaned surface of at least one wafer plate a film having a residual moisture from solvents containing silicates or phosphates is applied, the two wafer surfaces on at least one of which a film is applied are joined, the two wafers are tempered in the joined state at temperatures lower than approx. 420° C.

19 Claims, 1 Drawing Sheet

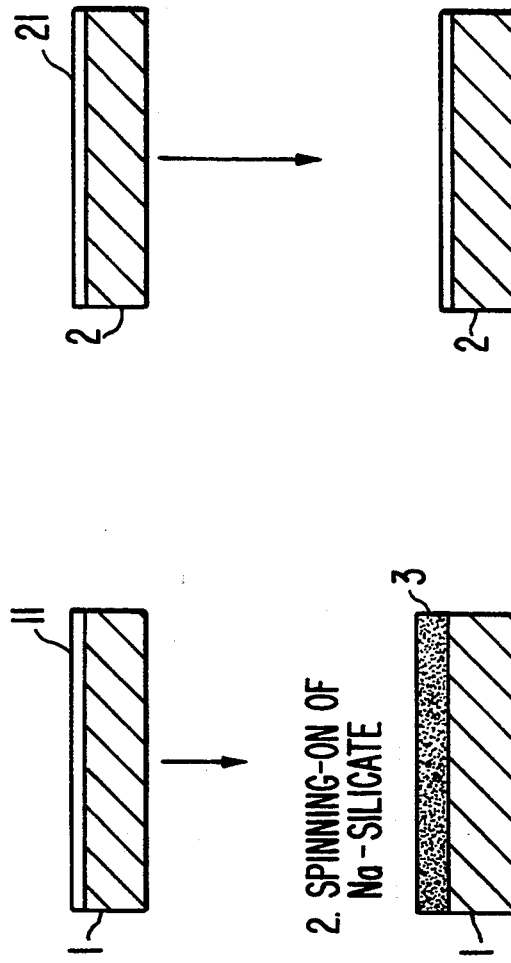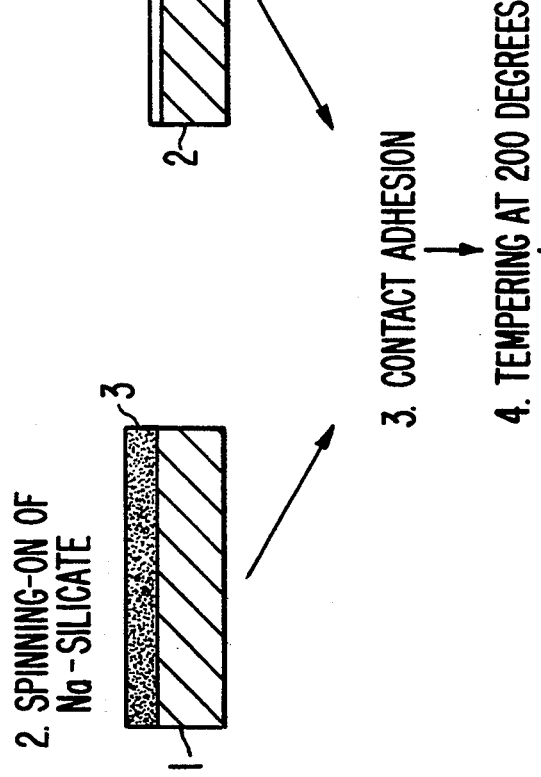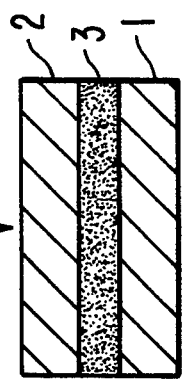

DIRECT SUBSTRATE BONDING

TECHNICAL FIELD

The present invention relates to a process for producing solid, surface bonding between two wafer plates of which at least one is composed of a semiconducting material, e.g. silicon.

STATE OF THE ART

In microstructure technology it is advantageous in the fabrication of complex microsystems, as by way of illustration sensors, actuators including microelectronic circuits, to join, for production reasons, separately fabricated and processed wafer plates of the same or different material permanently via the surface to a complex microsystem.

The fabrication of a sequence of layers, by way of illustration, with an epitactic process has noteably the drawback that the partly very complex and expensive epitaxy facilities require high investment costs. In comparison, the fabrication of semiconductor layer sequences using joining techniques is a less expensive alternative.

The state of the art joining techniques for wafer plates have, however, to some degree a number of different disadvantages:

In the state of the art direct substrate bonding processes, temperatures ranging between 700° C. and 1100° are required for the tempering procedure. Only these high temperatures, namely, yield permanently adhering wafer plates which possess sufficient adhesive power for further processing procedures.

In this connection, reference is made, by way of illustration, to EP-A-O 136 050 in which it is explicitly said that the "adhering" silicon wafers do not attain the necessary adhesive force until temperatures higher than 600° C.

Furthermore, from U.S. Pat. No. 4,883,215 a joining technique is known which functions similar to the so-called "bursting" of glass elements. With this joining techniques, not only silicon wafer plates but also wafer plates of silicon and insulation material, such as e.g. glass or semiconducting oxides can be joined.

Although no tempering procedures at high temperatures are required in this bonding technique, the adhesive force between the plates is, however, not sufficient for a number of individual cases. Furthermore, from U.S. Pat. No. 4,962,062, a process for joining two semiconductor wafer plates by means of an intermediate layer is known. In this state of the art process it is, however, necessary to introduce in at least one surface a special recess through which the adhesion is only then imparted. Moreover, this process also requires tempering procedures at temperatures between approximately 500° C. and 1200° C.

Thus, due to high process temperatures and special preparation of the wafer surfaces, this state of the art process permits joining wafer plates already possessing microelectronic surface structures, so-called processed wafer plates only with difficulty, for usually the maximum temperature with which the processed standard silicon substrate can be processed further is 420° C.

These low temperatures as tempering temperatures are according to the state of the art only then sufficient if the bonding processes are applied which use glass as the substrate material or as an intermediate layer:

In the so-called anodic bonding process, pyrex glass is bonded as the substrate material at 300° C. to a silicon wafer by means of the application of a strong electric field. The drawback here is the necessary confinement to the pyrex glass as the substrate material due to which many processes are prohibited (e.g. anistropic etching, electro-chemical etching stops) compared to the use of silicon.

Furthermore, it is known that in order to join two silicon substrates, a glass layer can be utilized as the intermediate layer, which may be composed of, by way of illustration pyrex or lead glass layers (thickness, approx. 0.5 to 5 $\mu$m) which are applied to one of the two wafers by means of sputtering.

On the other hand, borosilicate glasses, either fabricated by means of CVD processes or by doping, are also applied in bonding technology by pressing onto the uncoated wafer at about 460° C.

The problem with this process is the high processing temperature as well as the marked tendency of the borosilicate glass surface to precipitate boric acid through which joining wafer plates often becomes impossible.

All state of the art bonding techniques based on joining techniques, therefore, have the drawbacks that only special combinations of wafer materials can be utilized in each individual processes, that the adhesive force between the wafer plate only partly meets the demands of subsequent processing procedures and that the partly very high temperatures of more than 420° C. in the tempering procedures make joining "pre-processed" wafer plates impossible.

On the other hand, the known "low-temperature processes" usually are limited to a special substrate material and, furthermore, are complicated and therefore expensive to carry out.

DESCRIPTION OF THE INVENTION

The object of the present invention is to provide a process for producing solid, surface bonding between two, in particular, highly polished wafer plates of which at least one is composed of a Semiconducting material, such as e.g. silicon, ensuring an as great as possible adhesive force between the wafer plates and permitting combinations of different wafer plate materials.

Moreover, the individual process steps should be simple and easy to apply with the means of state of the art processing principles so that the invented process can be carried out at low cost.

An inventive solution to this object is set forth in claim hereto. Further improvements of the present invention are the subject of the sub-claims hereto.

An element of the present invention is to provide a process for producing solid, surface bonding between two, in particular, highly polished (claim 2) wafer plates of which at least one is composed of a semiconducting material, such, e.g. silicon, having the following process steps:

a film having residual moisture of solvents and containing silcates or phosphates is applied on the cleaned surface of at least one wafer plate, both the wafer surfaces on at least one of which said film is applied are joined, both said wafers are tempered in the joined state at temperatures less than approx. 420°.

The bond created in this manner is distinguished both by a high mechanical strength and great mechanical and chemical durability. Measurements have shown that the mechanical adhesive force ranges from 250 to 300 kg/cm². These high adhesive forces thus permit trouble-free further processing of the wafer plates for the fabrication of, e.g., highly complex microstructures or sensors, or the like.

When utilizing silicates, tempering can take place even at temperatures between 150° C. and 300° C., whereas in the utilization of phosphates the tempering procedure occurs at temperatures between 300° C. and 400° C., by way of illustration in an oven (claim 5).

The tempering procedure provides setting of the intermediate layers. The released water can, e.g. be absorbed by the silicon or silicon oxide surface of the silicon wafer and chemically bonded. This procedure, however, only functions reliably on thin layers ($\leq 100$ nm—cf. claim 4) as otherwise a too great a water content, resp. solvent content can lead to the formation of bubbles.

To store the wafers at room temperature, in particular for approx. 24 hours, after fixing and then temper them has proven to be especially useful (claim 7).

The formation of a very thin intermediate layer causes, moreover, no mechanical tensions worth mentioning (claim 17). In this case it is particularly advantageous that the adhesive forces caused by the film immediately after joining the wafer plates compensate any wafer warping.

The solvent from which the film has at least a certain residual moisture may in principle be any solvent for materials to be applied; in particular it is preferable, however, from an environmental aspect but also from a process aspect, the utilization of water described in claim 3 hereto.

At any rate, it is advantageous for the adhesive force if the wafer surfaces to be joined as set forth in claim 6 hereto are cleaned and dried prior to applying the film.

The invented process is for the most part independent of the wafer plate material:

By way of illustration, according to claim 8, the wafer plates may have metalized areas.

Furthermore, one wafer may be a silicon wafer and the other wafer a quarz glass wafer (claim 9), a GaAs wafer (claim 10) or an InP wafer (claim 11), with the list of the wafer materials given in the claims not being complete.

The applicability of the invented process for different materials is, in particular, the result of the fact that the bonding already attained at temperatures from approx. 200° to 300° C. are unusually strong, thereby opening the possibility of joining substrates of different materials, in particular, such having different temperature behavior.

With the invented process, therefore, bonding between silicon and quarz glass can be produced. Just as, bonding with other semiconducting materials or optically active materials such as, e.g. lithium niobate, is possible (claim 12).

In the latter case, it is however advantageous if an oxide intermediate layer, resp. a wafer layer is provided which, e.g., may be composed of a spin-on glass (claim 13, resp. 14). Claims 15 and 16 name as film material, noteably sodium silicate and aluminium phosphate without the intention of limiting overall applicability.

The film provided in accordance with the present invention may be applied as a fluid film (claim 18). Particularly advantageous is, however, if the film material with the residual moisture is applied with a spin dry process (claim 19).

A BRIEF DESCRIPTION OF THE DRAWING

The present invention is made more apparent in the following section using a preferred embodiment with reference to the accompanying drawing by way of example. In it is shown in:
FIG. 1 the wafer conditioning;
FIG. 2 the application of a film; and
FIG. 3 the wafer plates in a joined state.

Description of a Preferred Embodiment

FIG. 1 shows the conditioning of both wafers 1 and 2 to be joined. The wafers are first highly polished so that the surfaces 11 and 21 with which they are to be joined are "mirror surfaces" with very little particle density. For a durable and solid bond between the wafer plates is, noteably, a highly polished surface of the opposite wafer plates is particularly advantageous.

In a subsequent cleaning step, the surfaces 11 and 21 are freed of surface particles of soil by means of a cleansing solvent, such as e.g., nitric acid, pirania caustic, ammonium hydrogen peroxide, RCA cleansing.

The wafers are then rinsed and dried. For this essentially known spin techniques are utilized.

FIG. 2 shows that in another step a film 3 essentially composed of silicates or phosphates, such as e.g., sodium silicate or aluminium phosphate is applied under clean room conditions and, in particular, spun onto one of the two wafers, namely on the surface 11 of wafer 1.

The film may be applied as a diluted (aqueous) solution or as a film having a certain, relatively small residual moisture of a solvent, by way of illustration of water by means of a so-called spin drier, like those used in semiconductor industry for spinning on lacquer coats.

In the shown preferred embodiment, the film is composed of a homogeneous sodium silicate layer having a thickness of less than 100 nm. Due to the homogeneity and the little thickness, the adhesive forces beween the two wafer plates are raised.

Naturally, it is also possible to apply a film 3 onto each surface 11 and 21 respectively.

FIG. 3 shows that the two wafers 1 and 2 with the film 3 located between them are placed on top of each other at room temperauture. The strong adhesion of the two hydrophile surfaces provides for very close contact of the two wafers, resp. substrates 1 and 2 over the entire surface. The adhesion forces between the two wafers already suffice completely as fixing means of both wafers 1 and 2 and make shifting of the two surfaces 11 and 21 impossible.

Thereupon follows a tempering procedure conducted out at temperatures upto 420° C. Preferably, however, the tempering procedure is conducted at temperatures lying
   when using silicate solutions between 150° C. and 300° C. and in particular 200° C. resp.
   when using phosphate solutions between 300° C. and 420° C.

The thus yielded bond is distingished both by high mechanical strength as by great mechanical and chemical durability Measurements have revealed that the mechanical adhesive force ranges between (at least) 250 and 300 kg/cm². This very high adhesive force permits trouble-free further processing of the wafer plates for the fabrication of, e.g. highly complex microstructures or sensors or the like. The further handling of the two joined wafers is simple as the two wafers are joined by high bonding forces.

What is claimed is:

1. A process for producing a solid, surface bonding between two wafer plates, of which at least one is composed of a semiconducting material, such as e.g. silicon, having the following steps:

on the cleaned surface (11) of at least one said wafer plate (1) a film (3) having a residual moisture from solvents containing silicates or phosphates is applied, said two wafer surfaces (11, 21) on at least one of which said film (3) is applied are joined, said two wafers (1,2) are tempered in the joined state at temperatures lower than approx. 420° C.

2. A process according to claim 1, characterized by said two joined wafer surfaces being highly polished.

3. A process according to claim 1 or 2, characterized by said solvent being water.

4. A process according to one of the claims 1 to 3, characterized by the thickness of the layer of said film being a maximum of 100 nm.

5. A process according to one of the claims 1 to 4, characterized by said tempering procedure being conducted at temperatures lying when using silicate solutions between 150° C. and 300° C.

when using phosphate solutions between 300° C. and 420° C.

6. A process according to one of the claims 1 to 5, characterized by said joined wafer surfaces to be joined being cleaned and dried prior to the applicaiton of said film.

7. A process according to one of the claims 1 to 6, characterized by said wafer plates placed on top of each other being stored for approx. 24 hours at room temperature prior to said tempering procedure.

8. A process according to one of the claims 1 to 7, characterized by said wafer plates having metalized areas.

9. A process according to one of the claims 1 to 8, characterized by one wafer being a silicon wafer and the other wafer being a quarz glass wafer.

10. A process according to one of the claims 1 to 8, characterized by said one wafer being a silicon wafer and said other wafer being a GaAs wafer.

11. A process according to one of the claims 1 to 8, characterized by said one wafer being a silicon wafer and said other wafer being a InP wafer.

12. A process according to one of the claims 1 to 8, characterized by said one wafer being a wafer made of a semiconducting material and said other wafer being made of an optically active material, such as e.g. lithium niobate.

13. A process according to one of the claims 1 to 8, characterized by at least one said wafer having an oxide layer on the surface to be joined.

14. A process according to claim 13, characterized by said oxide layer being a spin-on glass.

15. A process according to one of the claims 1 to 14, characterized by said applied film being composed of sodium silicate.

16. A process according to one of the claims 1 to 14, characterized by said applied film being composed of aluminium phosphate.

17. A process according to one of the claims 1 to characterized by the adhesive forces caused by said film immediately following the joining of said wafer plates compensating for any wafer warping.

18. A process according to one of the claims 1 to 17, characterized by said film being applied as a liquid film.

19. A process according to one of the claims 1 to 17, characterized by the film material having a residual moisture being applied by means of a spin-dry process.

* * * * *